(12) United States Patent
Nakaya et al.

(10) Patent No.: US 9,484,988 B2
(45) Date of Patent: Nov. 1, 2016

(54) POWER SUPPLY DEVICE, POWER RECEIVING DEVICE, CHARGING SYSTEM, AND OBSTACLE DETECTION METHOD

(71) Applicant: Panasonic Corporation, Osaka (JP)

(72) Inventors: Satoshi Nakaya, Kanagawa (JP); Tsuyoshi Nishio, Chiba (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 205 days.

(21) Appl. No.: 14/378,240

(22) PCT Filed: Feb. 8, 2013

(86) PCT No.: PCT/JP2013/000689
§ 371 (c)(1),
(2) Date: Aug. 12, 2014

(87) PCT Pub. No.: WO2013/121757
PCT Pub. Date: Aug. 22, 2013

(65) Prior Publication Data
US 2015/0002090 A1 Jan. 1, 2015

(30) Foreign Application Priority Data

Feb. 13, 2012 (JP) .................... 2012-028543

(51) Int. Cl.
*H02J 7/00* (2006.01)
*H04B 5/00* (2006.01)
(Continued)

(52) U.S. Cl.
CPC ............ *H04B 5/0037* (2013.01); *H01F 38/14* (2013.01); *H02J 5/005* (2013.01); *H03C 1/00* (2013.01); *H03C 3/00* (2013.01); *H03D 1/00* (2013.01); *H03D 3/00* (2013.01); *H02J 7/025* (2013.01)

(58) Field of Classification Search
USPC ........................................ 320/108
See application file for complete search history.

(56) References Cited

U.S. PATENT DOCUMENTS

| 8,004,118 B2 | 8/2011 | Kamijo et al. |
| 2009/0127936 A1 | 5/2009 | Kamijo et al. |

(Continued)

FOREIGN PATENT DOCUMENTS

| CN | 101436791 A | 5/2009 |
| JP | 2005-073149 A | 3/2005 |

(Continued)

OTHER PUBLICATIONS

International Search Report for Application No. PCT/JP2013/000689 dated May 7, 2013.
(Continued)

*Primary Examiner* — Brian Ngo
(74) *Attorney, Agent, or Firm* — Pearne & Gordon LLP

(57) ABSTRACT

Provided are a power supply device, a power receiving device, a charging system, and an obstacle detection method that obtain a sufficient obstacle detection sensitivity even when an obstacle is small. A modulation unit (202) performs amplitude modulation or phase modulation on a test data sequence output from a test data sequence storage unit (201). A power control unit (203) generates, according to an instruction from a determination unit (204), a power control signal for increasing the power level of the test data sequence every time when the test data sequence is transmitted. The determination unit (204) determines whether there is an obstacle between the power receiving device and the power supply device based on whether the test data sequence output from the test data sequence storage unit (201) coincides with the test data sequence output from a power-transmitting-side receiving circuit (124).

10 Claims, 9 Drawing Sheets

(51) Int. Cl.
    *H02J 5/00*    (2016.01)
    *H01F 38/14*   (2006.01)
    *H03C 1/00*    (2006.01)
    *H03C 3/00*    (2006.01)
    *H03D 1/00*    (2006.01)
    *H03D 3/00*    (2006.01)
    *H02J 7/02*    (2016.01)

(56) References Cited

U.S. PATENT DOCUMENTS

| | | | |
|---|---|---|---|
| 2009/0261778 A1* | 10/2009 | Kook | H02J 7/0044 320/108 |
| 2009/0271047 A1 | 10/2009 | Wakamatsu | |
| 2009/0284227 A1* | 11/2009 | Mohammadian | G06K 7/0008 320/137 |
| 2009/0322281 A1* | 12/2009 | Kamijo | H02J 5/005 320/108 |
| 2010/0156343 A1* | 6/2010 | Jung | H02J 5/005 320/108 |
| 2010/0224725 A1 | 9/2010 | Perlman et al. | |
| 2010/0289450 A1 | 11/2010 | Kook | |
| 2011/0248668 A1* | 10/2011 | Davis | H01M 10/48 320/106 |
| 2011/0270462 A1 | 11/2011 | Amano et al. | |
| 2012/0235636 A1* | 9/2012 | Partovi | H02J 7/025 320/108 |
| 2012/0242276 A1* | 9/2012 | Jung | H02J 5/005 320/103 |

FOREIGN PATENT DOCUMENTS

| | | |
|---|---|---|
| JP | 2009-268310 A | 11/2009 |
| JP | 2010-119246 A | 5/2010 |
| JP | 2010-246292 A | 10/2010 |
| WO | 2008/050917 A1 | 5/2008 |
| WO | 2010/056683 A1 | 5/2010 |

OTHER PUBLICATIONS

Search Report dated Jan. 17, 2016 for CN201380008227.4.
Extended European Search Report for Application No. 13749243.5-1804/2816706 dated Aug. 12, 2015.

* cited by examiner

POWER SUPPLY DEVICE, POWER RECEIVING DEVICE, CHARGING SYSTEM, AND OBSTACLE DETECTION METHOD

TECHNICAL FIELD

The present invention relates to an electric supply apparatus that supplies electric power in a contactless manner using electromagnetic induction, an electric reception apparatus that receives supply of electric power from the electric supply apparatus, a charging system including the electric supply apparatus and the electric reception apparatus, and also to an obstacle detection method.

BACKGROUND ART

Heretofore, there has been known an energy supply technique that charges a storage battery mounted in a vehicle, using microwave. This energy supply technique supplies electric power to magnetrons from a microwave power source in an electric supply apparatus placed on the ground such as a parking lot and causes the magnetrons to generate microwaves. The microwaves generated from the respective magnetrons are sent through respective electric transmission antennas to an electric reception apparatus disposed at the bottom surface of the vehicle. The microwaves received by the electric reception apparatus are converted into electric power, rectified to be converted into DC electric power, and then supplied to the storage battery.

Meanwhile, such an energy supply technique has a problem in that, when there is an obstacle between an electric supply side and an electric reception side for microwaves, this obstacle decreases the transmission efficiency of microwaves. In addition, when the obstacle is a living thing, such as a human or an animal, the living thing is affected by the microwaves.

As a method of solving such problems, a method of detecting whether there is an obstacle between the electric supply side and the electric reception side is disclosed in Patent Literature (hereinafter, abbreviated as PTL) 1. PTL 1 discloses a technique for temporarily stopping electric transmission when the transmission efficiency of electric power supplied in a contactless manner from the electric transmission unit to the electric reception unit is less than a specified value. This is because there may be an obstacle between the electric transmission unit and the electric reception unit in this case.

CITATION LIST

Patent Literature

PTL 1
Japanese Patent Application Laid-Open No. 2010-119246

SUMMARY OF INVENTION

Technical Problem

The technique disclosed in PTL 1, however, has a problem in that the obstacle detection sensitivity is not sufficient in the case of a small obstacle because of a low variation in the transmission efficiency in this case.

It is an object of the present invention to provide an electric supply apparatus, an electric reception apparatus, a charging system, and an obstacle detection method that make it possible to obtain a sufficient obstacle detection sensitivity even in the case of a small obstacle.

Solution to Problem

An electric supply apparatus according to an aspect of the present invention is an apparatus supply apparatus that supplies electric power in a contactless manner to an electric reception apparatus provided in a vehicle, using electromagnetic induction, the electric supply apparatus including: a transmitting section that transmits a first test data string having a predetermined data sequence to the electric reception apparatus using the electromagnetic induction in a coil; a control section that controls the transmitting section to transmit the first test data string from the transmitting section; a receiving section that receives a data string transmitted from the electric reception apparatus as a second test data string obtained by the electric reception apparatus via demodulation of the first test data string received by the electric reception apparatus; and a determination section that determines whether there is an obstacle between the electric reception apparatus and the electric supply apparatus based on whether the first test data string transmitted by the transmitting section coincides with the second test data string received by the receiving section.

An electric reception apparatus according to an aspect of the present invention is an electric reception apparatus that is provided in a vehicle, that receives electric power in a contactless manner from an electric supply apparatus using electromagnetic induction, and that transmits a data string for determining whether there is an obstacle between the electric supply apparatus and the electric reception apparatus, the electric reception apparatus including: a receiving section that receives a first test data string transmitted from the electric supply apparatus using the electromagnetic induction in a coil; a demodulation section that demodulates the first test data string received by the receiving section and that generates a second test data string; and a transmitting section that transmits the second test data string generated by the demodulation section to the electric supply apparatus.

A charging system according to an aspect of the present invention is a charging system including: an electric reception apparatus that is provided in a vehicle; and an electric supply apparatus that supplies electric power in a contactless manner to the electric reception apparatus using electromagnetic induction, in which the electric supply apparatus includes: a first transmitting section that transmits a first test data string including a predetermined data sequence to the electric reception apparatus using the electromagnetic induction in a coil; an electric power control section that controls the first transmitting section to repeatedly transmit the first test data string from the transmitting section while increasing a transmission electric power level; a first receiving section that receives a data string transmitted from the electric reception apparatus as a second test data string obtained by the electric reception apparatus via demodulation of the first test data string received by the electric reception apparatus; and a determination section that determines whether the first test data string transmitted by the first transmitting section coincides with the second test data string received by the first receiving section, and determines whether there is an obstacle between the electric reception apparatus and the electric supply apparatus based on a transmission electric power level used for transmission of the first test data string from the transmitting section when the first test data string transmitted by the transmitting section coincides with the second test data string received by the receiving section, and the electric reception apparatus includes: a second receiving section that receives the first test data string from the electric supply apparatus; a demodulation section that demodulates the first test data string received by the second receiving section and that generates the second test data string; and a second transmitting section that transmits the second test data string generated by the demodulation section to the electric supply apparatus.

An obstacle detection method according to an aspect of the present invention is an obstacle detection method of determining whether there is an obstacle between an electric reception apparatus that is provided in a vehicle and an electric supply apparatus that supplies electric power in a contactless manner to the electric reception apparatus using electromagnetic induction, the method including: transmitting a first test data string including a predetermined data sequence to the electric reception apparatus using the electromagnetic induction in a coil; controlling transmission of the first test data string to be performed in the transmitting of the first test data string; and determining whether there is an obstacle between the electric reception apparatus and the electric supply apparatus based on whether the first test data string transmitted in the transmitting of the first test data string coincides with a second test data string obtained by the electric reception apparatus via demodulation of the first test data string received by the electric reception apparatus.

Advantageous Effects of Invention

The present invention makes it possible to obtain a sufficient obstacle detection sensitivity even in the case of a small obstacle.

DESCRIPTION OF EMBODIMENTS

Hereafter, embodiments of the present invention will be explained in detail with reference to the accompanying drawings.

Embodiment 1

Figure 1:
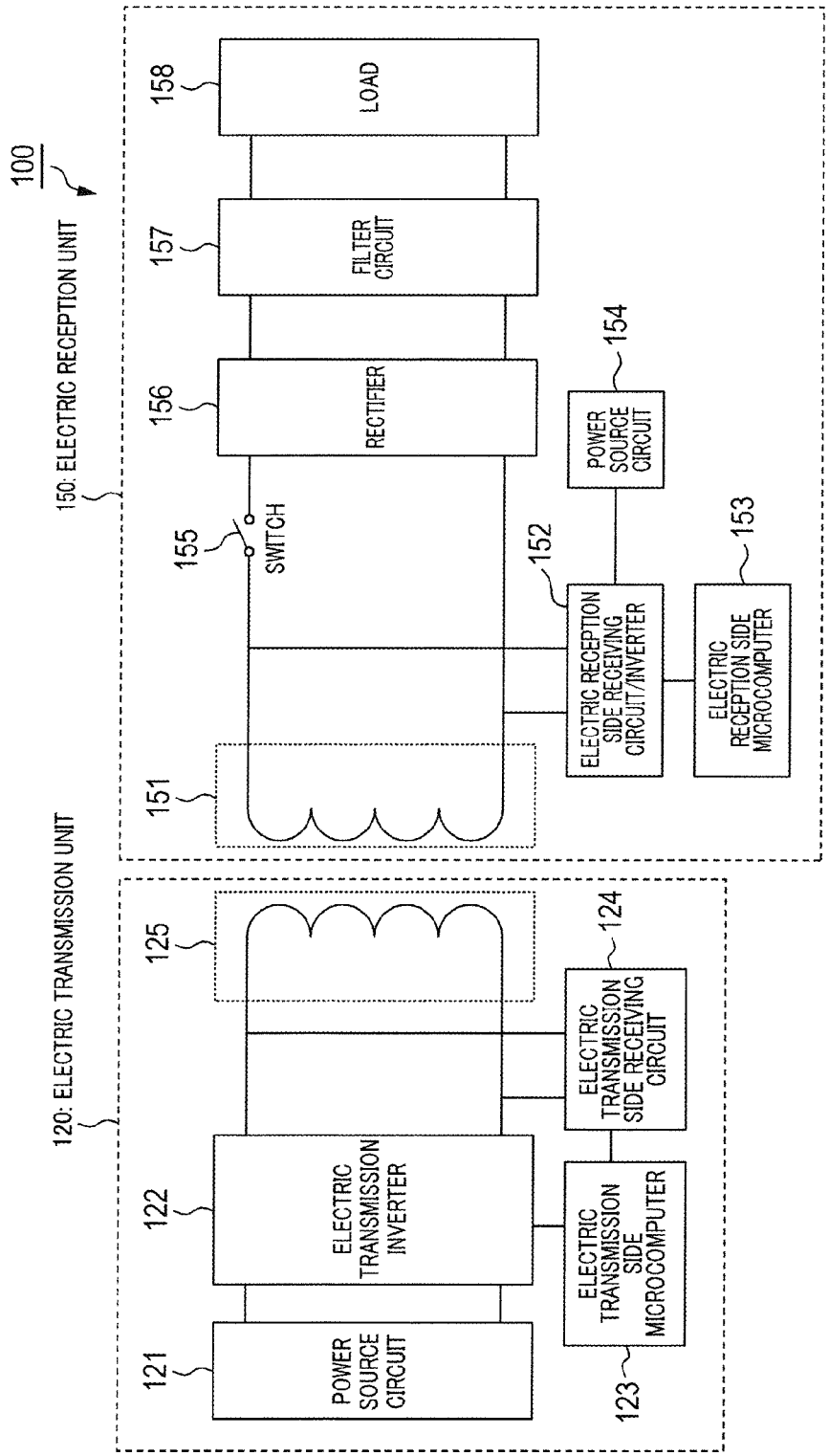
FIG. 1 is a block diagram illustrating the configuration of a charging system according to Embodiment 1 of the present invention.

FIG. 1 is a block diagram illustrating the configuration of charging system 100 according to Embodiment 1 of the present invention. Charging system 100 includes electric transmission unit 120 and electric reception unit 150.

Electric transmission unit 120 includes power source circuit 121, electric transmission inverter 122, electric transmission side microcomputer 123, electric transmission side receiving circuit 124, and electric transmission coil 125.

Power source circuit 121 is a power source that generates a direct current from a home power source, and for example, generates a DC power source from AC electric energy of approximately 100 to 240 V to output the DC power source to electric transmission inverter 122. Electric transmission inverter 122 generates higher frequency AC electric energy from DC electric energy outputted from power source circuit 121 according to the control of electric transmission side microcomputer 123, and supplies the higher frequency AC electric energy to electric transmission coil 125.

Electric transmission side microcomputer 123 previously stores a predetermined test data string (for example, an 8-bit string), and controls electric transmission inverter 122 to transmit the test data string with low electric power before the start of electric supply to electric reception unit 150. An assumption is made that the test data string is transmitted through amplitude modulation or phase modulation. Electric transmission side microcomputer 123 increases the transmission electric power level (hereinafter, simply referred to as "electric power level") of a test data string at every transmission of a test data string until receiving the correct test data string from electric transmission side receiving circuit 124. When receiving the correct test data string from electric transmission side receiving circuit 124, electric transmission side microcomputer 123 then determines whether there is an obstacle on the basis of the electric power level at that time.

Electric transmission side receiving circuit 124 receives the test data string transmitted from electric reception unit 150, and outputs the received test data string to electric transmission side microcomputer 123.

Electric transmission coil 125 generates electromagnetic induction from electric energy supplied from electric transmission inverter 122, and supplies electric power to electric reception coil 151 of electric reception unit 150.

Electric reception unit 150 includes electric reception coil 151, electric reception side receiving circuit/inverter 152, electric reception side microcomputer 153, power source circuit 154, switch 155, rectifier 156, filter circuit 157, and load 158.

Electric reception coil 151 supplies electric power supplied from electric transmission coil 125 of electric transmission unit 120 to electric reception side receiving circuit/inverter 152 and rectifier 156.

Electric reception side receiving circuit/inverter 152 demodulates the test data string included in the electric power supplied from electric reception coil 151, and outputs the demodulated test data string to electric reception side microcomputer 153.

Electric reception side microcomputer 153 amplitude-modulates the test data string outputted from electric reception side receiving circuit/inverter 152 using power source circuit 154, and controls electric reception side receiving circuit/inverter 152 to transmit the amplitude-modulated test data string to electric transmission unit 120 with an electric power level that can be received by electric transmission unit 120. In this way, electric transmission unit 120 and electric reception unit 150 transmit and receive the test data string mutually using the electromagnetic induction in the coil, and electric reception unit 150 amplitude-modulates the demodulation result of the test data string transmitted from electric transmission unit 120 without modification, and sends back the amplitude-modulated demodulation result to electric transmission unit 120. That is, even if the demodulated test data string has an error, the test data string having the error is sent back without modification.

Power source circuit 154 is, for example, a storage battery and is charged after the start of electric transmission.

Switch 155 is controlled by a not-illustrated control section to be turned off during transmission and reception of the test data string before the start of electric reception from electric transmission unit 120, and to be turned on after the starts of electric reception from electric transmission unit 120. Accordingly, switch 155 can isolate load 158 to avoid the influence on transmission and reception of the test data string.

Rectifier 156 rectifies a current supplied from electric reception coil 151, and filter circuit 157 filter-processes the current rectified by rectifier 156, and outputs the filter-processed current to load 158. Load 158 is a battery to be charged by this charging system and is charged with the current outputted from filter circuit 157.

Figure 2:
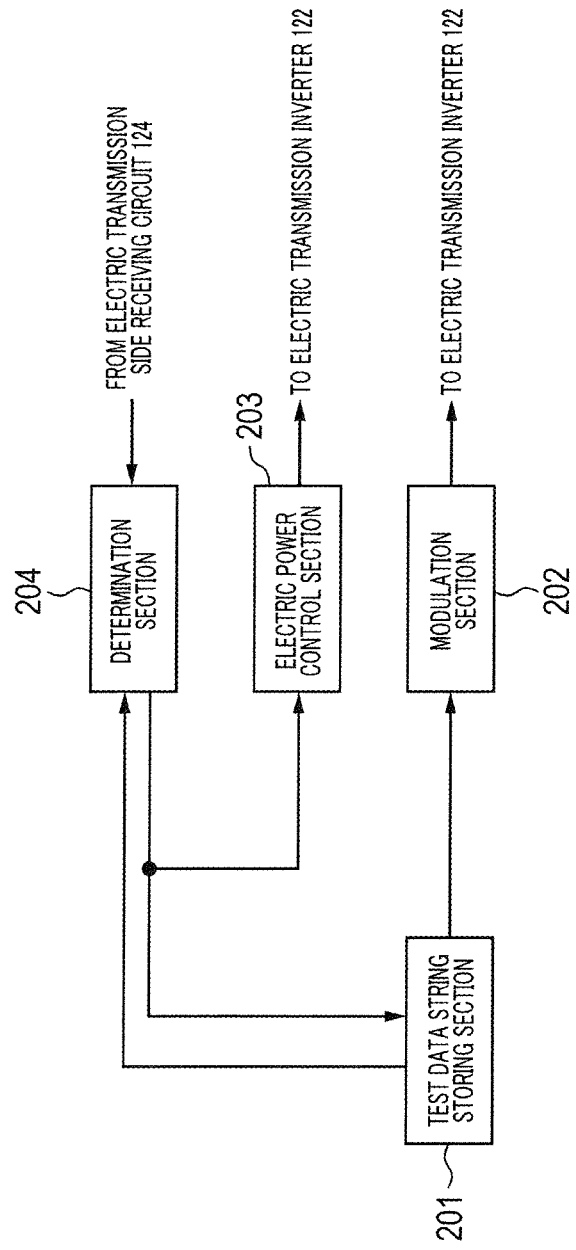
FIG. 2 is a block diagram illustrating the functional configuration of an electric transmission side microcomputer illustrated in FIG. 1.

FIG. 2 is a block diagram illustrating the functional configuration of electric transmission side microcomputer 123 illustrated in FIG. 1. In FIG. 2, test data string storing section 201 stores a test data string (for example, an 8-bit string) having a predetermined data sequence, and outputs the test data string to modulation section 202 and determination section 204 according to instructions from determination section 204.

Modulation section 202 amplitude-modulates or phase-modulates the test data string outputted from test data string storing section 201, and outputs the modulated test data string to the electric-transmission inverter 122.

According to instructions from determination section 204, electric power control section 203 generates an electric power control signal for increasing the electric power level of the test data string at every transmission of the test data string, and outputs the generated electric power control signal to electric transmission inverter 122.

Determination section 204 determines whether the test data string outputted from test data string storing section 201 coincides with the test data string from the electric reception side inverter, which is outputted from electric transmission side receiving circuit 124. Determination section 204 stores in advance the electric power level obtained when transmission and reception of a test data string in the case of no obstacle was successful. If the electric power level in the above determination resulting in coincidence is equal to the stored electric power level, determination section 204 determines that there is no obstacle. If the electric power level in the above determination resulting in coincidence exceeds the stored electric power level, determination section 204 determines that there is an obstacle.

Figure 3:
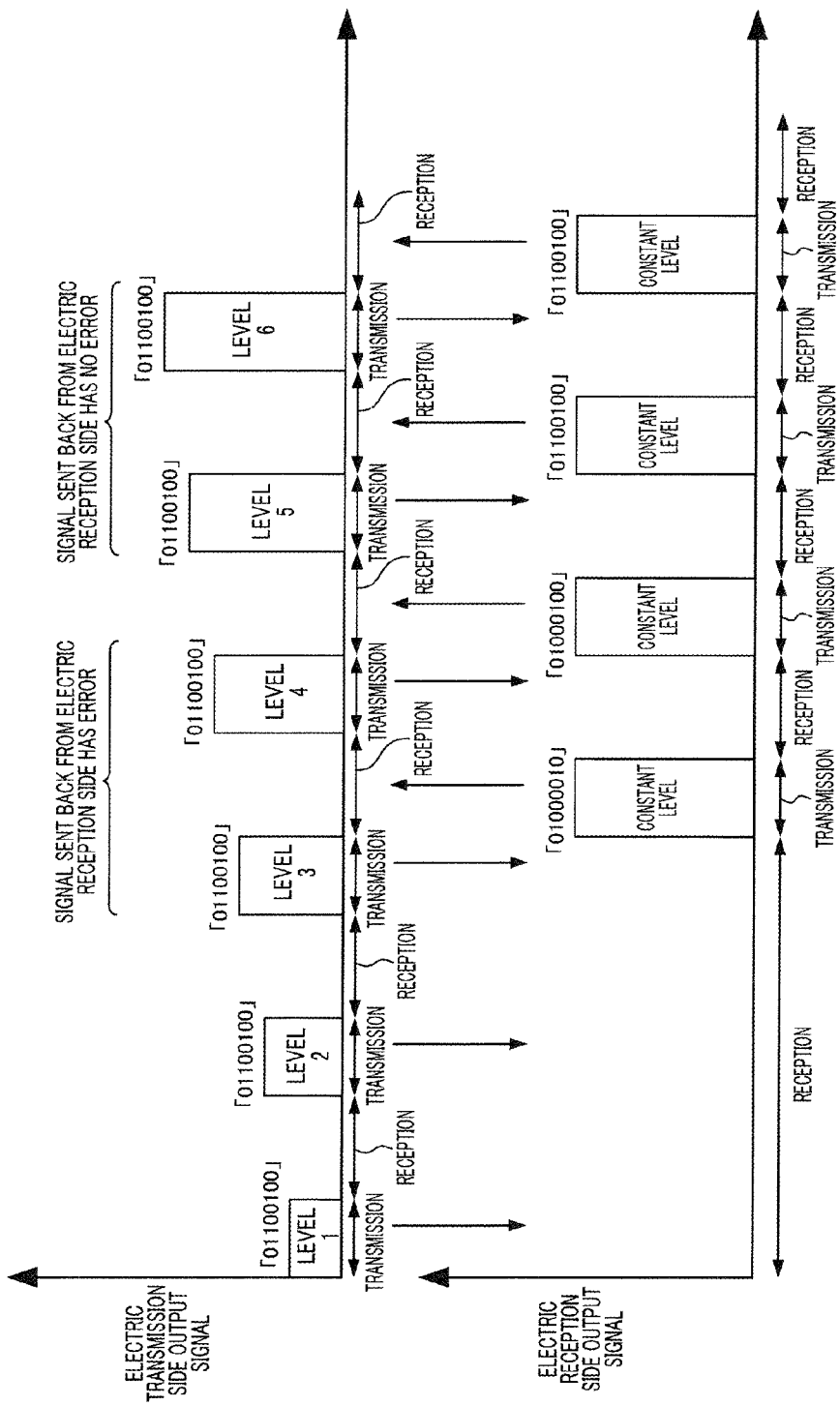
FIG. 3 illustrates how a test data string is transmitted and received between an electric transmission unit and an electric reception unit.

FIG. 3 illustrates how a test data string is transmitted and received between electric transmission unit 120 and electric reception unit 150. In this case, an assumption is made that there is no positional misalignment between electric transmission unit 120 and electric reception unit 150. In FIG. 3, electric transmission unit 120 transmits a test data string "01100100" at electric power level 1, which is the minimum electric power. At this time, electric reception unit 150 cannot receive the test data string at electric power level 1 and cannot send back the test data string.

Since the test data string transmitted at electric power level 1 cannot be received at a predetermined receiving timing, electric transmission unit 120 increases the level to electric power level 2 and transmits the test data string "01100100." Electric reception unit 150 cannot receive the test data string even at electric power level 2 and cannot send back the test data string.

Since the test data string transmitted at electric power level 2 cannot be received at a predetermined receiving timing, electric transmission unit 120 increases the level to electric power level 3 and transmits the test data string "01100100." Electric reception unit 150 has received the test data string, but the test data string has a receiving error due to the low electric power level. Thus, electric reception unit 150 sets the test data string to "01000010," and sends back the test data string to electric transmission unit 120 at the electric power level receivable by electric transmission unit 120.

Electric transmission unit 120 recognizes that the test data string transmitted at electric power level 3 has been received with an error by electric reception unit 150, thus increases the level to electric power level 4 and transmits the test data string "01100100." Electric reception unit 150 has received the test data string, but the test data string still has a receiving error due to the low electric power level. Thus, electric reception unit 150 sets the test data string to "01000100," and sends back the test data string to electric transmission unit 120.

Electric transmission unit 120 recognizes that the test data string transmitted at electric power level 4 is received with an error by electric reception unit 150, thus increases the level to electric power level 5 and transmits the test data string "01100100." Electric reception unit 150 correctly receives the test data string and therefore sends back the test data string "01100100" to electric transmission unit 120. In this case, if electric transmission unit 120 and electric reception unit 150 have previously succeeded in transmission and reception of the test data string at electric power level 5 in the case of no obstacle between electric transmission unit 120 and electric reception unit 150, electric transmission unit 120 determines that there is no obstacle between electric transmission unit 120 and electric reception unit 150. This success in transmission and reception means that the test data string transmitted by electric transmission unit 120 coincides with the test data string received from electric reception unit 150 by electric transmission unit 120.

For reference, when electric transmission unit 120 transmits the test data string "01100100" at electric power level 6, electric reception unit 150 correctly receives the test data string and sends back the test data string "01100100" to electric transmission unit 120.

In this way, inter-coil communication is performed between electric transmission coil 125 and electric reception coil 151; electric transmission unit 120 increases in a stepwise manner the electric power level in each repetitive transmission of a test data string until receiving a test data string coinciding with a transmitted test data string, from electric reception unit 150; if the electric power level of transmission used when electric transmission unit 120 has correctly received a test data string is equal to an electric power level used in previous successful transmission and reception of a test data string in the case of no obstacle, it is determined that there is no obstacle; and if the electric power level of transmission when electric transmission unit 120 has correctly received a test data string exceeds an electric power level used in previous successful transmission and reception of a test data string in the case of no obstacle, it is determined that there is an obstacle. Accordingly, it is possible to detect a small obstacle and thus to improve the obstacle detection sensitivity.

Figure 4:
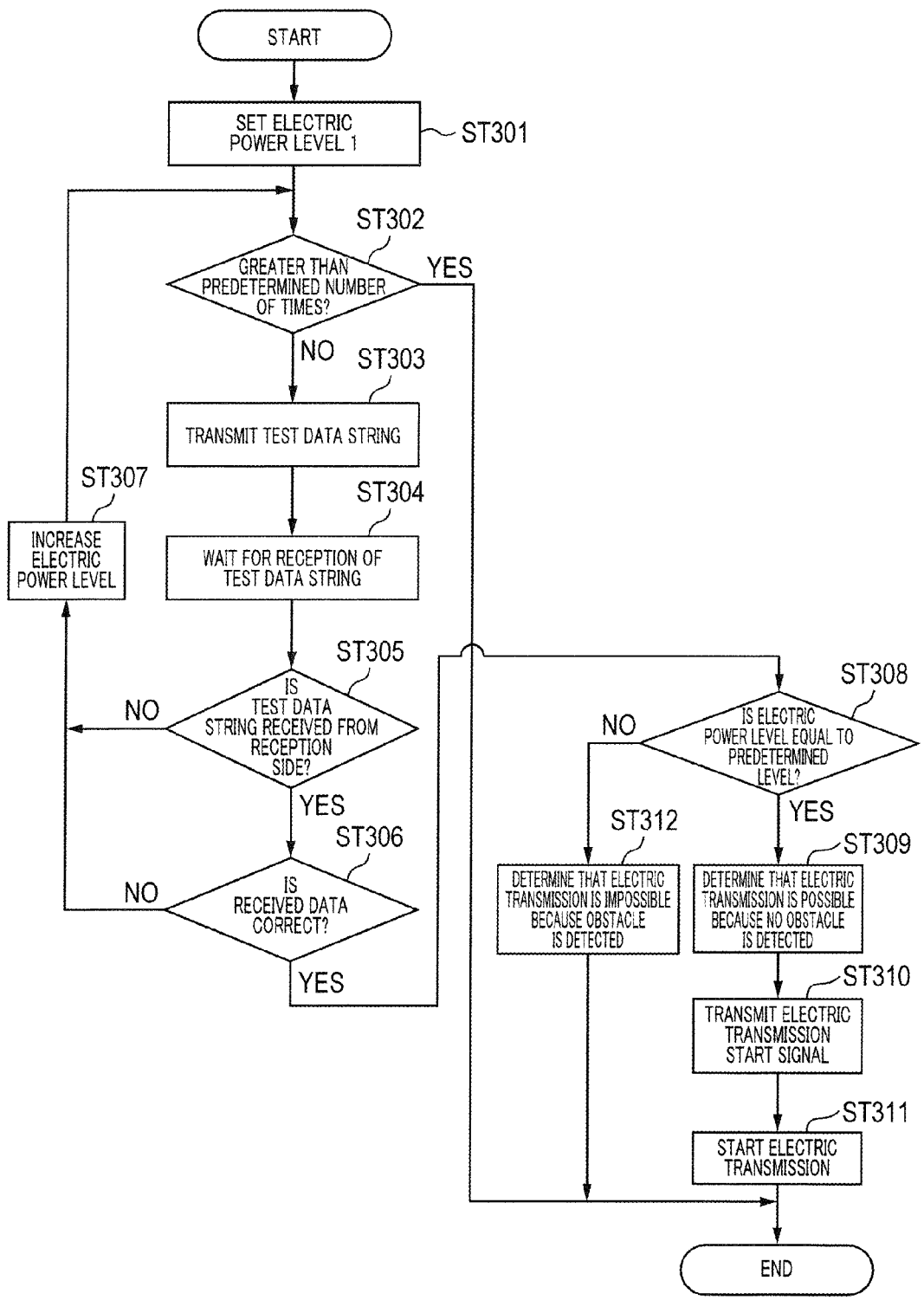
FIG. 4 is a flowchart illustrating an obstacle detection procedure of an electric transmission unit according to Embodiment 1 of the present invention.

FIG. 4 is a flowchart illustrating an obstacle detection procedure of electric transmission unit 120 according to Embodiment 1 of the present invention. In FIG. 4, Step (hereinafter abbreviated to "ST") 301 sets electric power level 1, and ST 302 determines whether test data strings are transmitted a number of times greater than a predetermined number of times, completes the obstacle detection procedure if the number of times of the transmission is equal to or more than the predetermined number of times, and progresses to ST 303 if the number of times of transmission is less than the predetermined number of times.

ST 303 transmits a test data string at the set electric power level, and ST 304 waits for reception of a test data string sent back from electric reception unit 150.

ST 305 determines whether the test data string sent back from electric reception unit 150 is received, progresses to ST 306 if it is received, and increases the electric power level in ST 307 and sends back to ST 302 if it is not received.

ST 306 determines whether the test data string sent back from electric reception unit 150 is correct, progresses to ST 308 if it is correct, and increases the electric power level in ST 307 to send back to ST 302 if it is not correct.

ST 308 determines whether an electric power level of transmission for correctly receiving a test data string is equal to an electric power level used in successful transmission and reception of a test data string in the case of no obstacle, progresses to ST 309 if this condition is satisfied, and progresses to ST 312 if this condition is not satisfied.

ST 309 determines that electric transmission is possible because of no obstacle, and ST 310 transmits an electric transmission start signal to electric reception unit 150. ST 311 starts electric transmission and completes the obstacle detection procedure.

ST 312 determines that electric transmission is impossible because of the presence of an obstacle, and completes the obstacle detection procedure.

Figure 5:
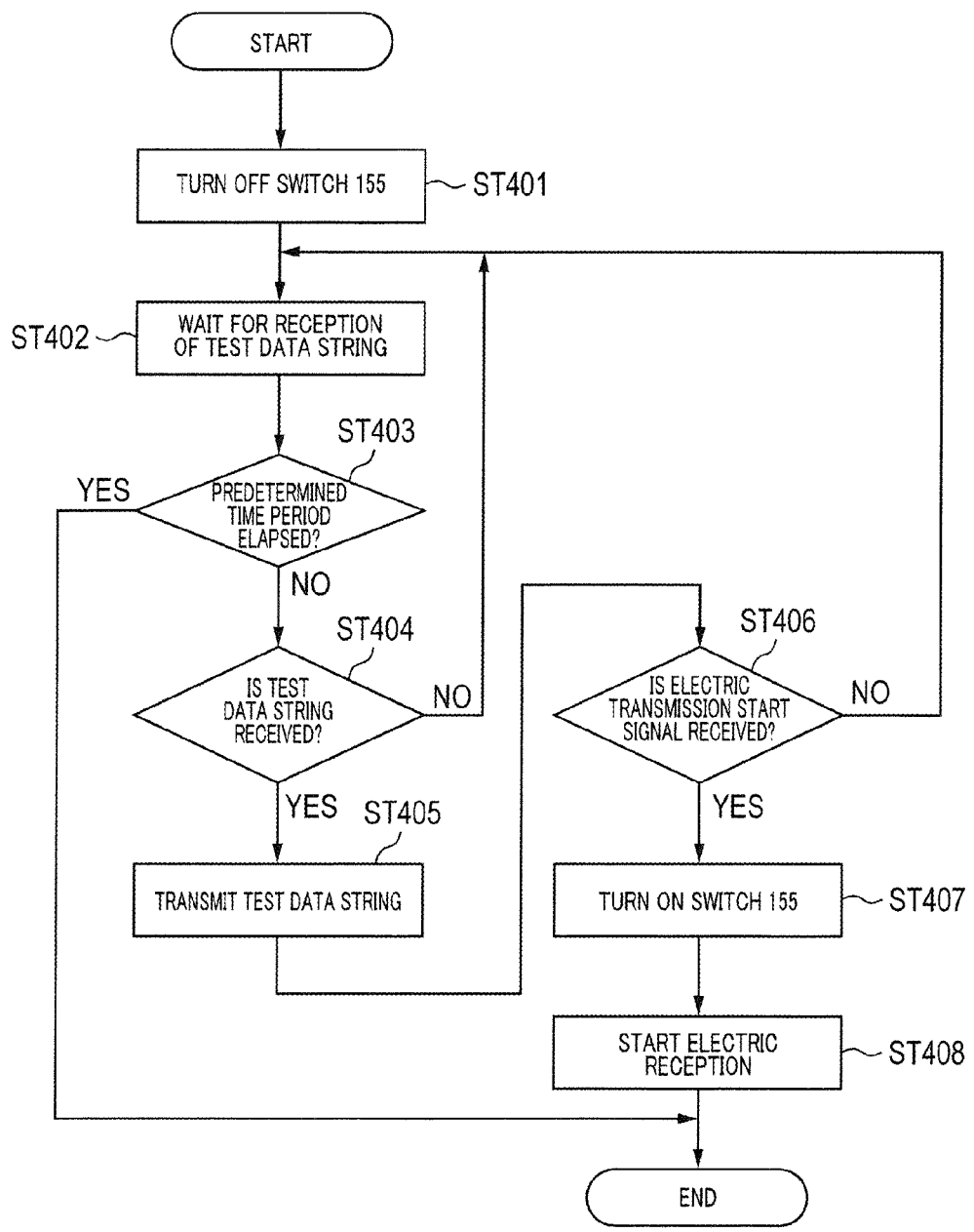
FIG. 5 is a flowchart illustrating an electric reception preparation procedure of an electric reception unit according to Embodiment 1 of the present invention.

FIG. 5 is a flowchart illustrating an electric reception preparation procedure of electric reception unit 150 according to Embodiment 1 of the present invention. In FIG. 5, ST 401 turns off switch 155, and ST 402 waits for reception of a test data string transmitted from electric transmission unit 120.

ST 403 determines whether a predetermined time period elapses after waiting for reception of a test data string, completes the electric reception preparation procedure if the predetermined time period elapses, and progresses to ST 404 if the predetermined time period does not elapse.

ST 404 determines whether a test data string is received, progresses to ST 405 if it is received, and sends back to ST 402 if it is not received.

ST 405 transmits the received test data string to electric transmission unit 120, ST 406 determines whether an electric transmission start signal is received, progresses to ST 407 if it is received, and sends back to ST 402 if it is not received.

ST 407 turns on switch 155, and ST 408 starts electric reception of electric power supplied from electric transmission unit 120.

In this way, according to Embodiment 1, the electric transmission unit increases in a stepwise manner the electric power level in each repetitive transmission of a test data string until receiving a test data string coinciding with a transmitted test data string, from the electric reception unit; and whether there is an obstacle is detected on the basis of an electric power level used for transmission in which the electric transmission unit has correctly received a test data string. Thus, a sufficient obstacle detection sensitivity can be obtained even in the case of a small obstacle.

In the above explanation of the present embodiment, a test data string is transmitted through inter-coil communication from the electric reception unit. However, the present invention is not limited to this case. The test data string may be transmitted from the electric reception unit to the electric transmission unit through another communication method, such as radio communication or infrared communication.

Embodiment 2

A charging system according to Embodiment 2 of the present invention has the same configuration as that illustrated in FIG. 1 of Embodiment 1 except that the functions of the electric transmission side microcomputer and the electric reception side microcomputer are different. Therefore, the different functions will be explained with reference to FIG. 1 and FIG. 2.

With reference to FIG. 2, test data string storing section 201 stores a test data string previously associated with each of electric power levels variable in a stepwise manner. For example, three bits 000 to 111 of a fifth bit to a seventh bit in an 8-bit test data string are previously associated with electric power levels 1 to 8. Test data string storing section 201 outputs a test data string to modulation section 202 and determination section 204 according to the instructions from determination section 204. Accordingly, a test data string corresponding to the control of an electric power level by electric power control section 203 can be transmitted.

Figure 6:
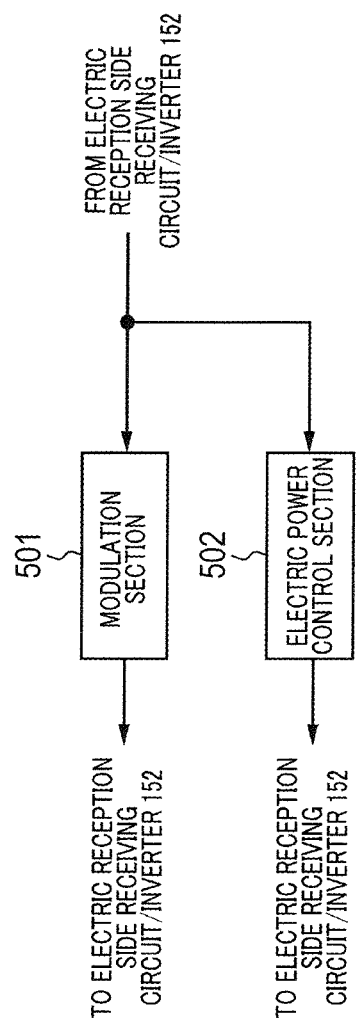
FIG. 6 is a block diagram illustrating the functional configuration of an electric reception side microcomputer according to Embodiment 2 of the present invention.

FIG. 6 is a block diagram illustrating the functional configuration of the electric reception side microcomputer according to Embodiment 2 of the present invention. In FIG. 6, modulation section 501 amplitude-modulates or phase-modulates a demodulated test data string outputted from electric reception side receiving circuit/inverter 152, and outputs the modulated test data string to electric reception side receiving circuit/inverter 152.

Electric power control section 502 generates an electric power control signal indicating an electric power level represented by the demodulated test data string outputted from electric reception side receiving circuit/inverter 152, and outputs the generated electric power control signal to electric reception side receiving circuit/inverter 152.

Figure 7:
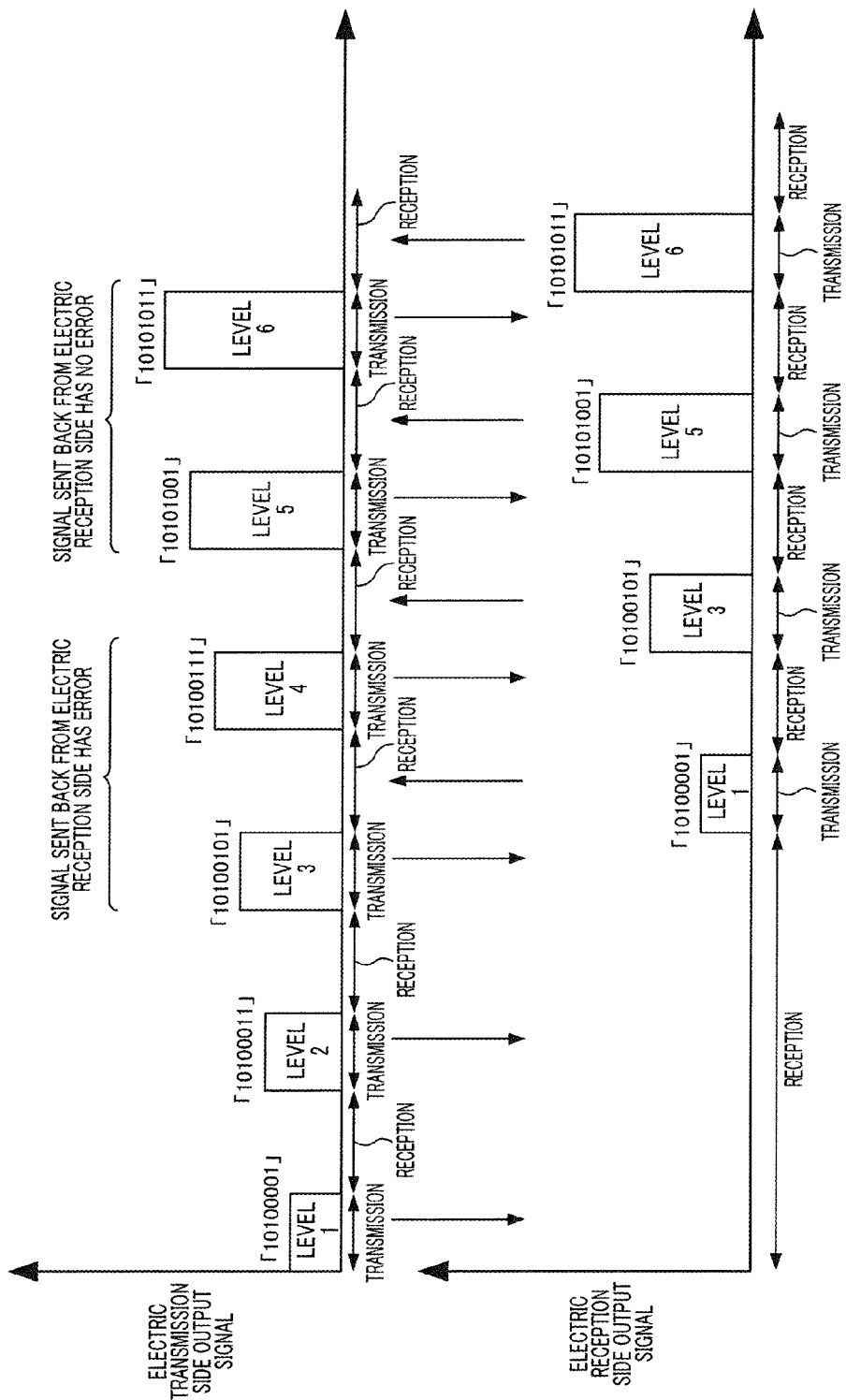
FIG. 7 illustrates how a test data string is transmitted and received between an electric transmission unit and an electric reception unit.

FIG. 7 illustrates how a test data string is transmitted and received between electric transmission unit 120 and electric reception unit 150. In this case, an assumption is made that there is no positional misalignment between electric transmission unit 120 and electric reception unit 150. In FIG. 7, electric transmission unit 120 transmits a test data string "10100001" representing electric power level 1 at electric power level 1, which is the minimum electric power. At this time, electric reception unit 150 cannot receive the test data string at electric power level 1 and cannot send back the test data string.

Since the test data string transmitted at electric power level 1 cannot be received at a predetermined receiving timing, electric transmission unit 120 increases the level to electric power level 2 and transmits the test data string "10100011" representing electric power level 2. Electric reception unit 150 cannot receive the test data string even at electric power level 2 and cannot send back the test data string.

Since the test data string transmitted at electric power level 2 cannot be received at a predetermined receiving timing, electric transmission unit 120 increases the level to electric power level 3 and transmits the test data string "10100101" representing electric power level 3. Electric reception unit 150 has received the test data string, but the test data string has a receiving error due to the low electric power level. Thus, electric reception unit 150 sends back the test data string "10100001" representing electric power level 1 to electric transmission unit 120.

Since the test data string transmitted at electric power level 3 cannot be received at a predetermined receiving timing, electric transmission unit 120 increases the level to electric power level 4 and transmits the test data string "10100111" representing electric power level 4. Electric reception unit 150 has received the test data string, but the test data string still has a receiving error due to the low electric power level. Thus, electric reception unit 150 sends back the test data string "10100101" representing electric power level 3, at electric power level 3 to electric transmission unit 120.

Electric transmission unit 120 recognizes that the test data string transmitted at electric power level 4 is received with an error by electric reception unit 150, thus increases the level to electric power level 5 and transmits the test data string "10101001" representing electric power level 5. Electric reception unit 150 correctly receives the test data string and therefore sends back the test data string "10101001" representing electric power level 5, at electric power level 5 to electric transmission unit 120. In this case, if electric transmission unit 120 and electric reception unit 150 have previously succeeded in transmission and reception of the test data string at electric power level 5 in the case of no obstacle between electric transmission unit 120 and electric reception unit 150, electric transmission unit 120 determines that there is no obstacle between electric transmission unit 120 and electric reception unit 150.

For reference, if electric transmission unit 120 transmits the test data string "10101011" representing electric power level 6, at electric power level 6; electric reception unit 150 correctly receives the test data string and sends back the test data string "10101011" representing electric power level 6, at electric power level 6 to electric transmission unit 120.

In this way, inter-coil communication is performed between electric transmission coil 125 and electric reception coil 151; electric transmission unit 120 increases in a stepwise manner the electric power level in each repetitive transmission of a test data string in each of electric transmission unit 120 and electric reception unit 150 until receiving a test data string coinciding with a transmitted test data string, from electric reception unit 150; if the electric power level of transmission used when electric transmission unit 120 has correctly received a test data string is equal to an electric power level used in previous successful transmission and reception of a test data string in the case of no obstacle, it is determined that there is no obstacle; and if the electric power level of transmission when electric transmission unit 120 has correctly received a test data string exceeds an electric power level used in previous successful transmission and reception of a test data string in the case of no obstacle, it is determined that there is an obstacle. Accordingly, it is possible to detect a small obstacle and thus to improve the obstacle detection sensitivity.

Moreover, in contrast to the case where the electric power level from the reception side is fixed, the electric power level from the reception side is also increased in a stepwise manner, so that certain transmission and reception sensitivities are required bi-directionally, which results in a more strict condition for successful communication. Thus, the obstacle detection sensitivity can be further improved.

Figure 8:
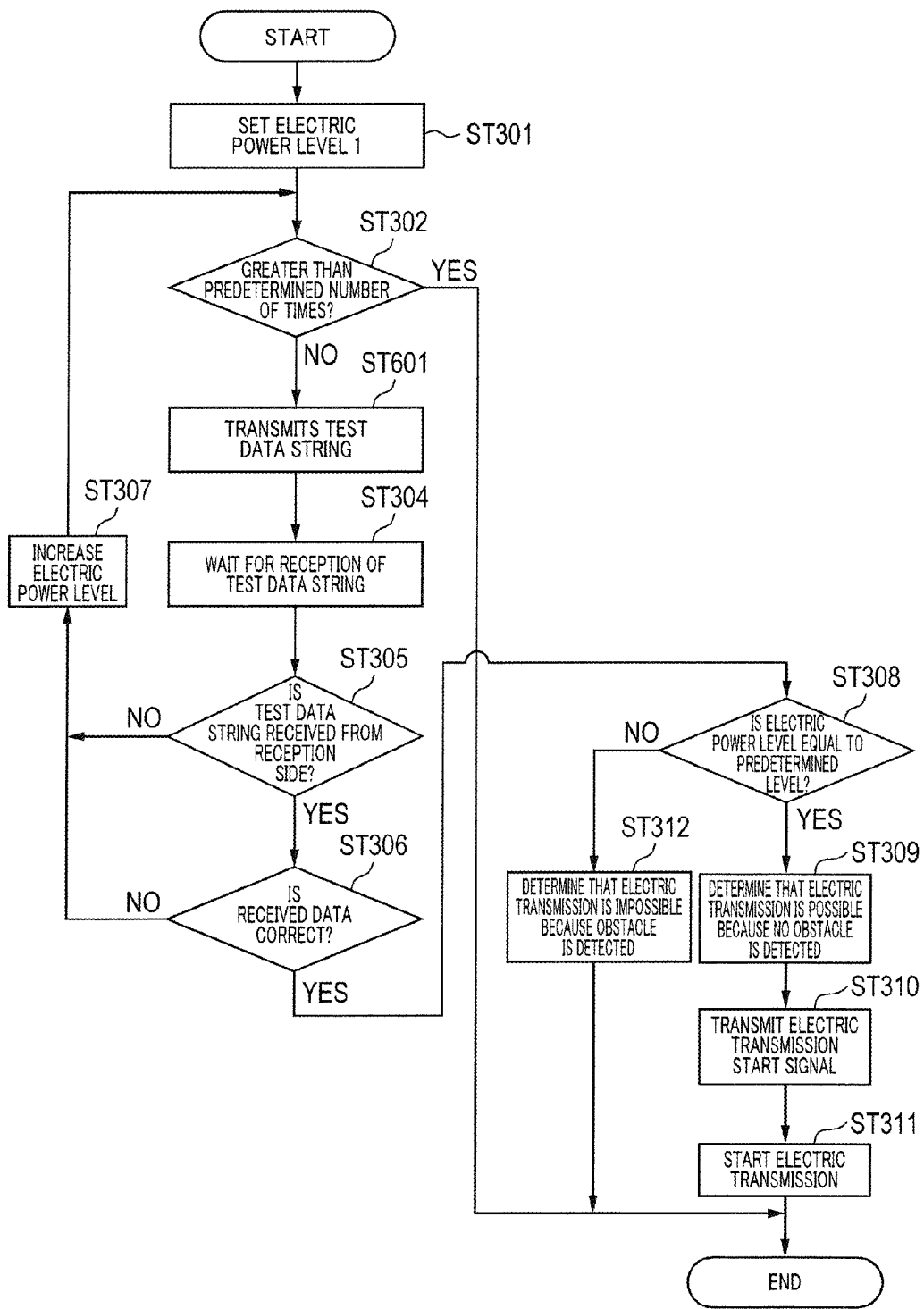
FIG. 8 is a flowchart illustrating an obstacle detection procedure of an electric transmission unit according to Embodiment 2 of the present invention.

FIG. 8 is a flowchart illustrating an obstacle detection procedure of the electric transmission unit according to Embodiment 2 of the present invention. The same steps in FIG. 8 as those in FIG. 4 are assigned the same reference numerals as those in FIG. 4, and repetitive explanations thereof will be omitted. In FIG. 8, ST 601 transmits a test data string representing a set electric power level, at the electric power level.

Figure 9:
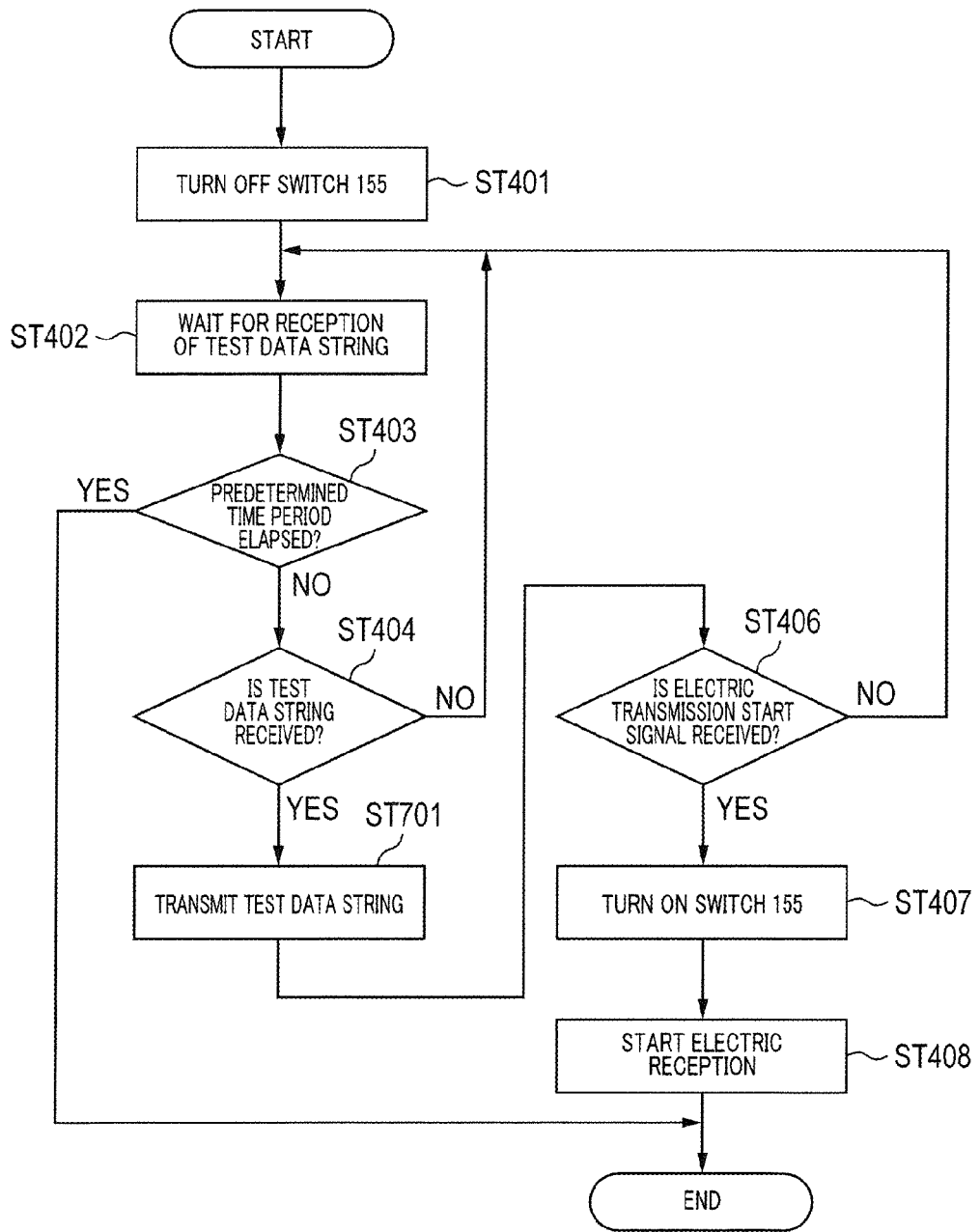
FIG. 9 is a flowchart illustrating an electric reception preparation procedure of an electric reception unit according to Embodiment 2 of the present invention.

FIG. 9 is a flowchart illustrating an electric reception preparation procedure of the electric reception unit according to Embodiment 2 of the present invention. The same steps in FIG. 9 as those in FIG. 5 are assigned the same reference numerals as those in FIG. 5, and repetitive explanations thereof will be omitted. In FIG. 9, ST 701 transmits a received test data string to the electric transmission unit at an electric power level represented by the received test data string.

In this way, according to Embodiment 2, the electric transmission unit increases in a stepwise manner the electric power level in each repetitive transmission of a test data string in each of electric transmission unit and electric reception unit until receiving a test data string coinciding with a transmitted test data string, from the electric reception unit; and whether there is an obstacle is detected on the basis of an electric power level used for transmission in which the electric transmission unit has correctly received a test data string. Thus, a sufficient obstacle detection sensitivity can be obtained even in the case of a small obstacle.

In the above explanation, each embodiment involves the test data string having 8 bits. However, the present invention is not limited to this case. The number of bits may be 8 or greater depending on the number of electric power levels variable in a stepwise manner. Alternatively, a parity bit may be used in the test data string to detect an error.

In each of the above-described embodiments, in order to determine the electric power level used in previous successful transmission and reception of a test data string between the electric transmission unit and the electric reception unit, the minimum necessary sufficient electric power level for successful transmission and reception of a test data string may be sought by once decreasing a transmission electric power level to check whether to succeed in transmission and reception of a test data string again and by checking whether to succeed in transmission and reception of the test data string a plurality of times at the minimum transmission electric power level.

The disclosure of Japanese Patent Application Number 2012-028543 filed on Feb. 13, 2012 including the specification, drawings and abstract is incorporated herein by reference in its entirety.

INDUSTRIAL APPLICABILITY

The electric supply apparatus, electric reception apparatus, charging system, and obstacle detection method according to the present invention are suitable for obtaining a sufficient obstacle detection sensitivity.

REFERENCE SIGNS LIST

100 Charging system
120 Electric transmission unit 121, 154 Power source circuit
122 Electric transmission inverter
123 Electric transmission side microcomputer
124 Electric transmission side receiving circuit
125 Electric transmission coil
150 Electric reception unit
151 Electric reception coil
152 Electric reception side receiving circuit/inverter
153 Electric reception side microcomputer
154 Power source circuit
155 Switch
156 Rectifier
157 Filter circuit
158 Load
201 Test data string storing section
202, 501 Modulation section
203, 502 Electric power control section
204 Determination section

The invention claimed is:

1. An electric supply apparatus that supplies electric power in a contactless manner to an electric reception apparatus provided in a vehicle, using electromagnetic induction, the electric supply apparatus comprising:
a transmitting section that transmits a first test data string having a predetermined data sequence to the electric reception apparatus using the electromagnetic induction in a coil;
a control section that controls the transmitting section to transmit the first test data string from the transmitting section;
a receiving section that receives a data string transmitted from the electric reception apparatus as a second test data string obtained by the electric reception apparatus via demodulation of the first test data string received by the electric reception apparatus; and
a determination section that determines whether there is an obstacle between the electric reception apparatus and the electric supply apparatus based on whether the first test data string transmitted by the transmitting section coincides with the second test data string received by the receiving section.

2. The electric supply apparatus according to claim 1, wherein:
the control section controls the transmitting section to repeatedly transmit the first test data string from the transmitting section while increasing a transmission electric power level; and
the determination section determines whether there is an obstacle between the electric reception apparatus and the electric supply apparatus based on a transmission electric power level used for transmission of the first test data string from the transmitting section when the first test data string transmitted by the transmitting section coincides with the second test data string received by the receiving section.

3. The electric supply apparatus according to claim 1, wherein:
the determination section determines that there is no obstacle when a transmission electric power level of the first test data string of a case where the first test data string transmitted from the transmitting section coincides with the second test data string received by the receiving section is equal to a transmission electric power level that is previously measured when the first test data string and the second test data string coincide with each other in a state where there is no obstacle; and the determination section determines that there is an obstacle when the transmission electric power level exceeds the transmission electric power level that is previously measured when the first test data string and the second test data string coincide with each other in a state where there is no obstacle.

4. The electric supply apparatus according to claim 1, further comprising a modulation section that amplitude-modulates or phase-modulates the first test data string.

5. The electric supply apparatus according to claim 1, wherein the first test data string includes a plurality of data sequences associated with the respective transmission electric power levels variable in a stepwise manner.

6. An electric reception apparatus that is provided in a vehicle, that receives electric power in a contactless manner from an electric supply apparatus using electromagnetic induction, and that transmits a data string for determining whether there is an obstacle between the electric supply apparatus and the electric reception apparatus, the electric reception apparatus comprising:
a receiving section that receives a first test data string transmitted from the electric supply apparatus using the electromagnetic induction in a coil;
a demodulation section that demodulates the first test data string received by the receiving section and that generates a second test data string; and
a transmitting section that transmits the second test data string generated by the demodulation section to the electric supply apparatus.

7. The electric reception apparatus according to claim 6, further comprising an electric power control section that performs a control so that a transmission electric power level of the second test data string to be transmitted by the transmitting section increases in each transmission of the second test data string in a stepwise manner.

8. A charging system comprising:
an electric reception apparatus that is provided in a vehicle; and
an electric supply apparatus that supplies electric power in a contactless manner to the electric reception apparatus using electromagnetic induction, wherein
the electric supply apparatus includes:
a first transmitting section that transmits a first test data string including a predetermined data sequence to the electric reception apparatus using the electromagnetic induction in a coil;
an electric power control section that controls the first transmitting section to repeatedly transmit the first test data string from the transmitting section while increasing a transmission electric power level;
a first receiving section that receives a data string transmitted from the electric reception apparatus as a second test data string obtained by the electric reception apparatus via demodulation of the first test data string received by the electric reception apparatus; and
a determination section that determines whether the first test data string transmitted by the first transmitting section coincides with the second test data string received by the first receiving section, and determines whether there is an obstacle between the electric reception apparatus and the electric supply apparatus based on a transmission electric power level used for transmission of the first test data string from the transmitting section when the first test data string transmitted by the transmitting section coincides with the second test data string received by the receiving section, and the electric reception apparatus includes:
- a second receiving section that receives the first test data string from the electric supply apparatus;
- a demodulation section that demodulates the first test data string received by the second receiving section and that generates the second test data string; and
- a second transmitting section that transmits the second test data string generated by the demodulation section to the electric supply apparatus.

9. An obstacle detection method of determining whether there is an obstacle between an electric reception apparatus that is provided in a vehicle and an electric supply apparatus that supplies electric power in a contactless manner to the electric reception apparatus using electromagnetic induction, the method comprising:
- transmitting a first test data string including a predetermined data sequence to the electric reception apparatus using the electromagnetic induction in a coil;
- controlling transmission of the first test data string to be performed in the transmitting of the first test data string; and
- determining whether there is an obstacle between the electric reception apparatus and the electric supply apparatus based on whether the first test data string transmitted in the transmitting of the first test data string coincides with a second test data string obtained by the electric reception apparatus via demodulation of the first test data string received by the electric reception apparatus.

10. The obstacle detection method according to claim 9, wherein:
- in the controlling of transmission of the first test data string, the transmission of the first test data string is controlled to be repeatedly performed while increasing a transmission electric power level; and
- in the determining of whether there is an obstacle, whether there is an obstacle between the electric reception apparatus and the electric supply apparatus is determined based on a transmission electric power level used for transmission of the first test data string in the transmitting of the first test data string when the first test data string transmitted in the transmitting of the first test data string coincides with the second test data string obtained via the demodulation.

* * * * *